United States Patent
Cheng et al.

(10) Patent No.: US 10,788,757 B2
(45) Date of Patent: Sep. 29, 2020

(54) METROLOGY METHOD AND APPARATUS, COMPUTER PROGRAM AND LITHOGRAPHIC SYSTEM

(71) Applicant: ASML Netherlands B.V., Veldhoven (NL)

(72) Inventors: Su-Ting Cheng, Eindhoven (NL); Sergei Sokolov, Utrecht (NL); Armand Eugene Albert Koolen, Nuth (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/379,267

(22) Filed: Apr. 9, 2019

(65) Prior Publication Data
US 2019/0317413 A1    Oct. 17, 2019

(30) Foreign Application Priority Data
Apr. 13, 2018    (EP) .................................... 18167216

(51) Int. Cl.
*G01B 11/00*    (2006.01)
*G03F 7/20*    (2006.01)
*G01B 11/26*    (2006.01)

(52) U.S. Cl.
CPC .......... *G03F 7/70625* (2013.01); *G01B 11/26* (2013.01); *G03F 7/70633* (2013.01); *G03F 7/70641* (2013.01); *G03F 7/70683* (2013.01)

(58) Field of Classification Search
CPC ............ G03F 7/70625; G03F 7/70633; G03F 7/70641; G03F 7/70683; G03F 7/70941; G01B 11/26
See application file for complete search history.

(56) References Cited

U.S. PATENT DOCUMENTS

| | | |
|---|---|---|
| 2005/0012928 A1 | 1/2005 | Sezginer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0242970 A1 | 9/2012 | Smilde et al. |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2016/096524 A1 | 6/2016 |
| WO | WO 2018/046284 A1 | 3/2018 |

OTHER PUBLICATIONS

International Search Report and Written Opinion of the International Searching Authority directed to related International Patent Application No. PCT/EP2019/057040, dated Jun. 3, 2019; 11 pages.

*Primary Examiner* — Peter B Kim
(74) *Attorney, Agent, or Firm* — Sterne, Kessler, Goldstein & Fox P.L.L.C.

(57) ABSTRACT

Disclosed is a method of mitigating for a process dependent stray light artifact on a measurement a structure. The method comprises obtaining a calibration scaling factor for the process dependent stray light artifact based on a reference angle resolved measurement and target angle resolved measurement, and a correction of an image with the obtained calibration scaling factor.

20 Claims, 4 Drawing Sheets

METROLOGY METHOD AND APPARATUS, COMPUTER PROGRAM AND LITHOGRAPHIC SYSTEM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target structure and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The target structures used by conventional scatterometers are relatively large, e.g., 40 µm by 40 µm, gratings and the measurement beam generates a spot that is smaller than the grating (i.e., the grating is underfilled). This simplifies mathematical reconstruction of the target structure as it can be regarded as infinite. However, in order to reduce the size of the target structures, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such target structures are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller target structures. These target structures can be smaller than the illumination spot and may be surrounded by product structures on a wafer. Target structures can comprise multiple targets which can be measured in one image.

In the known metrology technique, overlay measurement results are obtained by measuring the target structure twice under certain conditions, while either rotating the target structure or changing the illumination mode or imaging mode to obtain separately the $-1^{st}$ and the $+1^{st}$ diffraction order intensities. The intensity asymmetry, a comparison of these diffraction order intensities, for a given target structure provides a measurement of target asymmetry, that is asymmetry in the target structure. This asymmetry in the target structure can be used as an indicator of overlay error (undesired misalignment of two layers).

Also sensor errors (e.g., errors in a sensor or detector used to detect scattered radiation from a target) are typically calibrated for by performing one or more offline sensor calibration steps. Such calibration steps may comprise a calibration for stray light artifacts or ghosts in the system. It would be desirable to improve calibration for stray light artifacts or "ghosts" in the system.

SUMMARY OF THE INVENTION

The invention in a first aspect provides a method of mitigating for a process dependent stray light artifact on a measurement of a structure, said method comprising obtaining a calibration scaling factor for the process dependent stray light artifact based on a reference angle resolved measurement and target angle resolved measurement.

The invention further provides an inspection apparatus for measuring a parameter of interest of a lithographic process, the inspection apparatus being operable to perform the method of the first aspect.

The invention further provides a non-transitory computer program product comprising processor readable instructions which, when run on suitable processor controlled apparatus, cause the processor controlled apparatus to perform the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
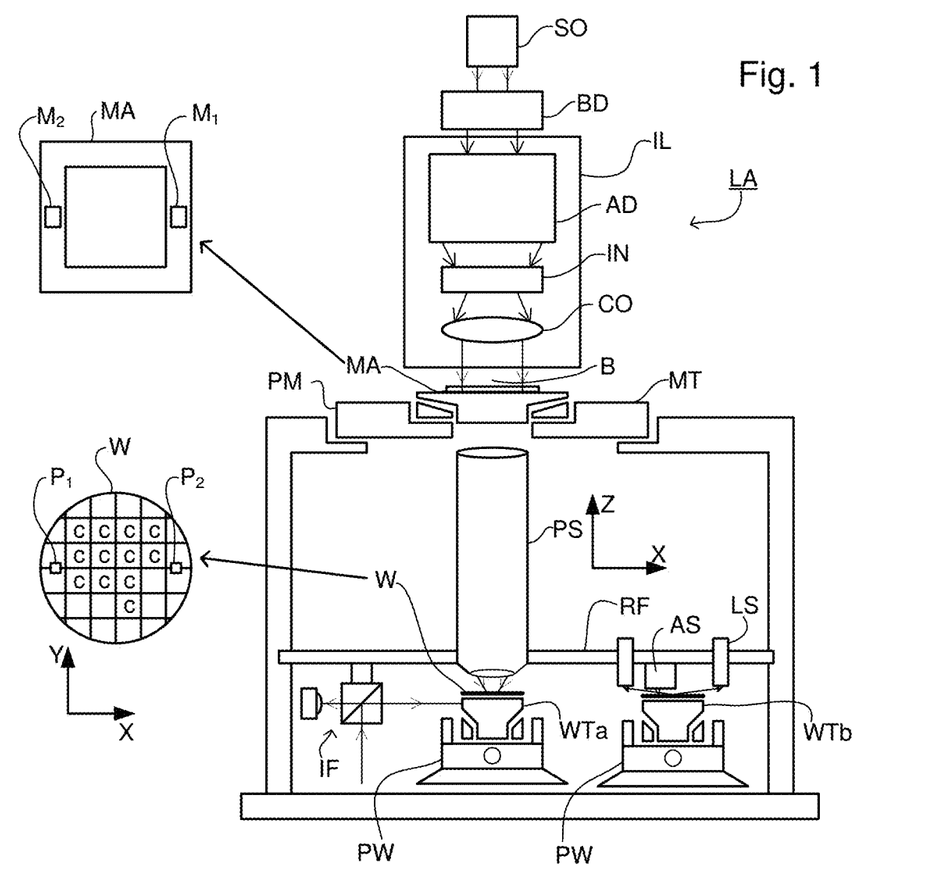
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 3A:
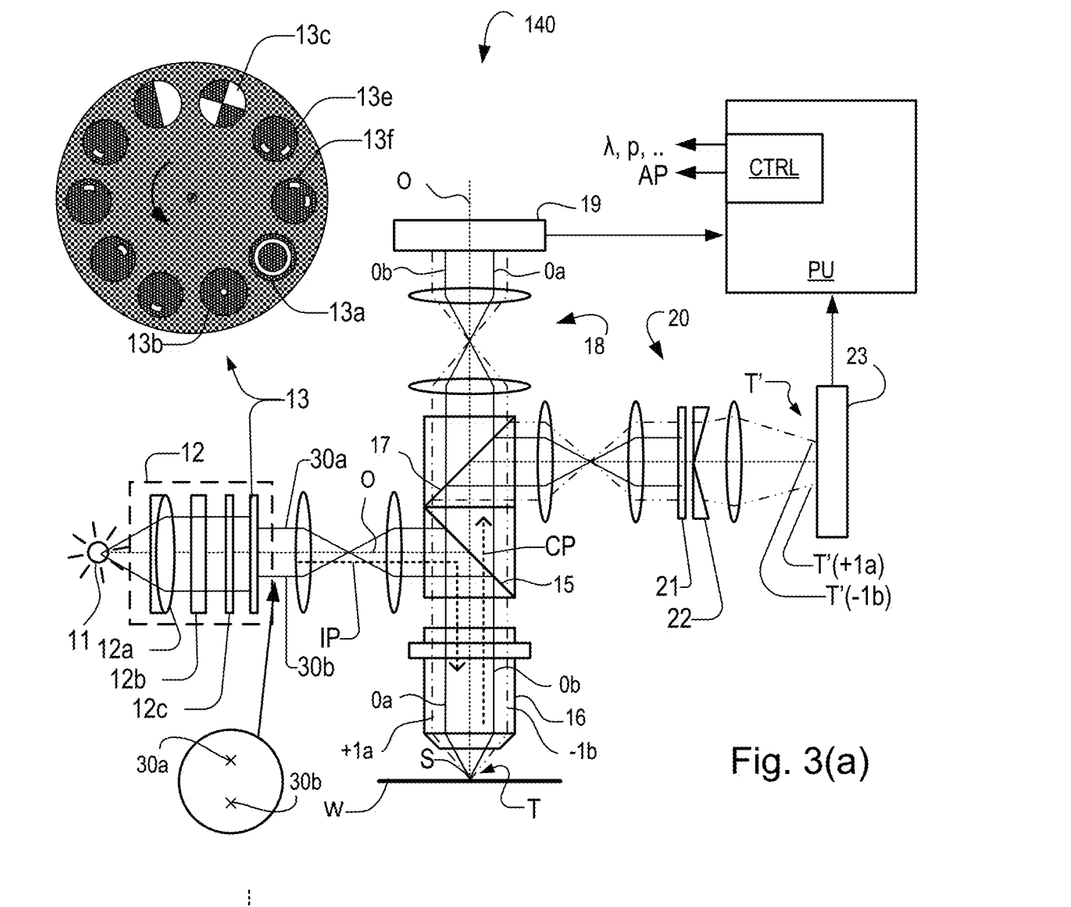
FIGS. 3(a)-3(b) illustrate schematically 3(a) an inspection apparatus adapted to perform angle-resolved scatterometry and dark-field imaging inspection methods in accordance with some embodiments of the invention and 3(b) an enlarged detail of the diffraction of incident radiation by a target grating in the apparatus of FIG. 3(a)
Figure 3B:
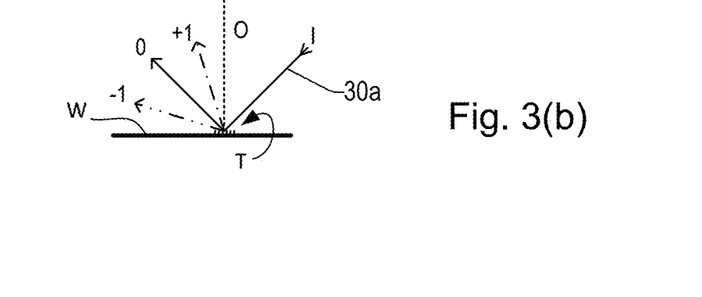

FIG. 3 shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-field—imaging apparatus of FIG. 3(a) may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via an objective lens 16. A metrology target T may be formed on substrate W. The objective lens 16 may be similar in form to a microscope objective lens, but has a high numerical aperture (NA), preferably at least 0.9 and more preferably at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that, after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus. In the case of gratings, the structure is periodic. In the case of an overlay metrology target, the grating is printed on top of or interleaved with another grating that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and with the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures 13a, 13b, 13c etc. mounted on a movable slide or wheel. It may alternatively comprise a fixed or programmable spatial light modulator (SLM). As a further alternative, optical fibers may be disposed at different locations in the illumination pupil plane and used selectively to deliver light or not deliver light at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Depending on the illumination mode, example rays 30a may be provided so that the angle of incidence is as shown at 'I' in FIG. 3(b). The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 3(a), the zero order rays of the first and second example illumination modes are labeled 0a and 0b respectively.

As shown in more detail in FIG. 3(b), target grating T as an example of a target structure is placed with substrate W normal to the optical axis O of objective lens 16. In the case of an off-axis illumination profile, a ray 30a of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, the diffracted radiation of each order +1 and −1 will be further spread over a range of angles, not a single ideal ray as shown.

If the target has multiple periodic components, then each of those will give rise to first and higher diffracted rays, which may be in directions into or out of the page. The example of FIG. 3(b) is merely describing a one-dimensional grating for simplicity.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams were combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Processor and controller PU also generates control signals such as λ and AP, for controlling the illumination characteristics (polarization, wavelength) and for selecting the aperture using aperture device 13 or a programmable spatial light modulator. Aperture stop 21 may also be controlled in the same way. Each combination of these parameters of the illumination and the detection is considered a "recipe" for the measurements to be made.

Referring again to FIG. 3(b) and the illuminating rays 30a, +1 order diffracted rays from the target grating will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Apertures 13c, 13e and 13f in the aperture device 13 of FIG. 3(a) include off-axis illumination in both X and Y directions, and are of particular interest for the present disclosure. Aperture 13c creates what may be referred to as a segmented illumination profile, and may for example be used in combination with a segmented aperture defined for example by a segmented prism 22, described below. Apertures 13e and 13f may for example be used in combination with an on-axis aperture stop 21, in a manner described in some the prior published patent applications, mentioned above.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted light to the sensor. In a further example, a segmented prism 22 is used in combination with an on-axis illumination mode. The segmented prism 22 can be regarded as a combination of individual off-axis prisms, and can be implemented as a set of prisms mounted together, if desired. These prisms define a segmented aperture in which rays in each quadrant are deflected slightly through an angle. This deflection in the pupil plane in has the effect of spatially separating the +1 and −1 orders in each direction in the image plane (a plane conjugate to the substrate plane). In other words, the radiation of each diffraction order and direction forms an image to different locations on sensor 23 so that they can be detected and compared without the need for two sequential image capture steps. Effectively, separate images are formed at separated locations on the image sensor 23. In FIG. 3(a) for example, an image T'(+1a), made using +1 order diffraction from illuminating ray 30a, is spatially separated from an image T'(−1b) made using −1 order diffraction from illuminating ray 30b. This technique is disclosed in the above-mentioned published patent application US20110102753A1, the contents of which are hereby incorporated by reference in its entirety. 2nd, 3rd and higher order beams (not shown in FIG. 3) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

Whichever of these techniques is used, the present disclosure applies to methods in which radiation diffracted in two directions, for example the orthogonal directions called X and Y, is simultaneously captured.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

Another issue which affects overlay measurements are asymmetries and other errors in the sensor. To address these, several calibration steps are typically performed at an image (pixel) level, between acquisition of an image in sensor's camera to final calculation of parameters such as overlay and focus (i.e., focus of the exposure radiation at the substrate plane during exposure). Such calibration steps may include calibrations for: dark current offset of camera, CCD non-linearity, internal and external ghosts and spot inhomogeneity. Subsequently, the corrected image is imported to a pattern recognition algorithm for signal extraction and the mean intensity values are reported.

Stray light artifacts or "ghosts" (detected images on a sensor caused by stray light) are sometimes present in metrology devices. A calibration may be performed, which corrects for these ghosts, where the ghost travels via the substrate or other structure in the substrate domain, and which carries wafer stack or process properties. Ghosts with process dependence can be found in both dark field (image plane) and pupil plane images. Using the specific example of the apparatus of FIG. 3(a), these ghosts are an issue for both measurement branches of the apparatus; i.e., pupil plane measurement branch which measures an angle-resolved spectrum and the image plane (dark field) measurement branch which measures an image of the target (with specular reflection blocked). These ghosts are typically caused by imperfections in the illuminator of the metrology apparatus, and become more of an issue as they start to increasingly affect performance in metrology applications. For cases where diffraction efficiencies are small and diffracted signals are low, ghosts become a significant problem as their relative intensity becomes significantly large in comparison to the metrology signal.

Many ghosts encountered are process dependent, as they enter the objective together with the main signal, interact with a wafer under test and then exit the objective and onto the detector carrying angle-dependent reflection properties. Such ghost signals overlap spatially with first order (diffracted) metrology signal and therefore cannot be easily separated from it. Currently there is no available solution to process dependent ghosts. This leads to a poor unmatched performance of such metrology apparatuses and, in some cases, to extremely strong differences in results between different tools of the same design.

Figure 4:
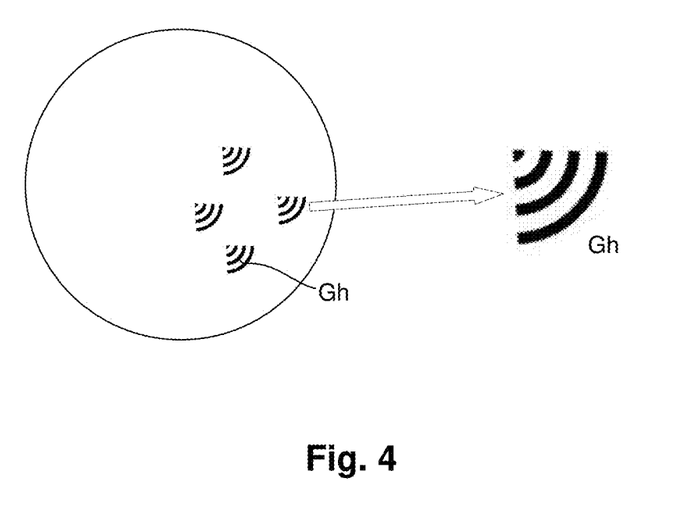
FIG. 4 schematically shows a representation of an image comprising a number of process dependent ghosts with one of these magnified.

FIG. 4 is a representation of a first order zone detected image (i.e., the detected image of the first diffraction order in the dark field measurement branch of the apparatus of FIG. 3(a)). A number of ghosts Gh can be seen on the image, one of which is shown magnified. This is an example of a "wifi ghost", so called because its shape resembles the well-known symbol for wifi (and as such is represented thusly in this figure). Such a ghost may result from scratch or dig defects or particles on a particular lens element within the metrology apparatus, and which causes large angle scattering. Due to the out-of-focus nature of such a defect, this ghost will have a spatial intensity distribution that is process dependent: the angle-resolved reflection spectrum from the substrate maps onto the field domain as the far field from a point defect.

Figure 5A:
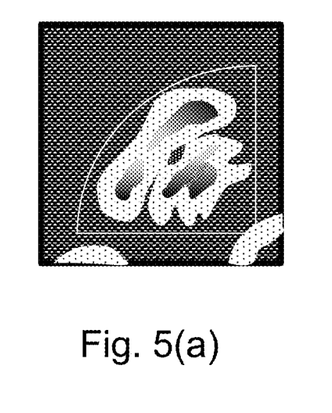
FIGS. 5(a)-5(b) schematically show a representation of 5(a) an image of a process dependent ghost obtained from a first reference fiducial and 5(b) an image of the same process dependent ghost obtained from a second reference fiducial.
Figure 5B:
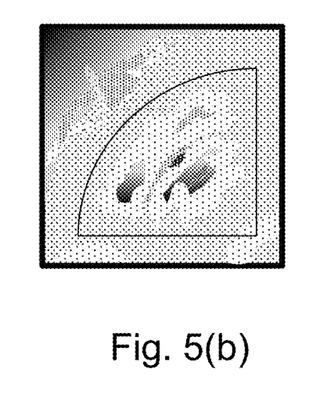

FIG. 5 illustrates this process dependency. It shows (a) a wifi ghost measured using a silicon fiducial and (b) the same wifi ghost measured (on the same apparatus) using an aluminum fiducial. In the absence of process dependency, the shape of the ghosts should be the same, with only a constant intensity ratio evident. However, it can be seen that while the outline of the ghost is similar, the internal shapes of the two ghosts of FIGS. 5(a) and 5(b) are very different.

A novel calibration is therefore proposed which corrects for process dependent ghosts, including such wifi ghosts and any other ghosts which show a process dependency.

In one aspect, the calibration comprises determining a calibration based on a comparison of a zero order angle resolved spectrum obtained from a reference substrate (e.g., a reference fiducial) and a zero order angle resolved spectrum obtained from measurement of a target. Such a comparison may comprise determining a calibration ratio from the two spectra and using this ratio to calibrate ghosts imaged in the dark field. In a further embodiment, the method may also comprise using such a calibration ratio to calibrate ghosts in angle-resolved pupil plane measurements.

Figure 6:
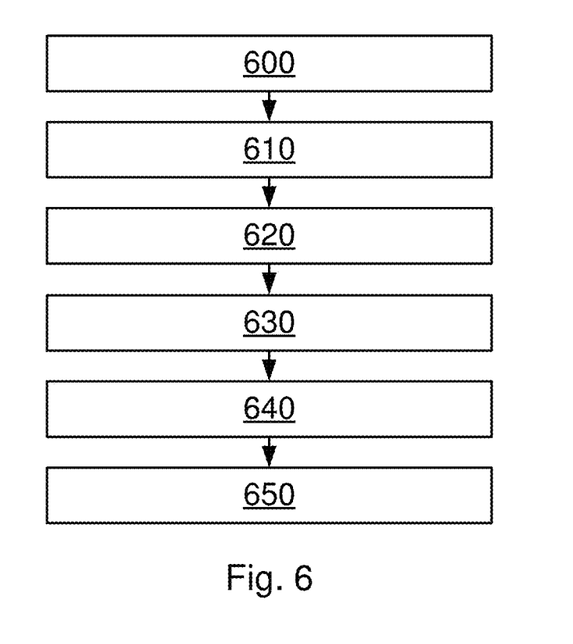
FIG. 6 is a flowchart of a method according to a first embodiment of the invention.

FIG. 6 is a flow diagram showing a first calibration method according to a dark field embodiment (i.e., for correcting ghosts in a dark field image).

In a first step 600, a reference dark field image is obtained using a reference substrate or fiducial (e.g., a reflective surface such as polished silicon). This step may also comprise measuring the energy level via an energy sensor.

At step 610, the location(s) of all (process dependent) ghosts within reference dark field image obtained in step 600 are identified. This may be done using pattern recognition techniques, for example. Orientation and scaling are well known.

At step 620, a reference zeroth order angle resolved spectrum (pupil plane image) is measured on the reference substrate. This measurement should be performed using an illumination mode which ensures (in the absence of ghosts) separation of the zeroth order and all higher diffraction orders in the detected pupil plane image. Such an illumination mode may, for example, be obtained by using a quad aperture (two diagonally opposed quarters passing the illumination and the other two diagonally opposed quarters blocking the illumination), such as illustrated in FIG. 3(a) labeled 13c. The skilled person will know other suitable illumination modes which ensure such separation of the zeroth order. A small overlap of orders can be accommodated, though this would result in a corresponding error in the correction (over or under correction).

At step 630, a dark field measurement of a target on a substrate is performed using a normal dark field measurement mode such as described in relation to FIG. 3, to obtain a target image. Once again, this step may also comprise measuring the energy level via an energy sensor.

At step 640, a target zeroth order angle resolved spectrum (pupil plane image) is measured on the target on the substrate. As with step 620, the illumination mode should ensure separation of the zeroth order and all higher diffraction orders (e.g., the same illumination mode is used in steps 620 and 640).

At step 650, each of the process dependent ghosts identified at step 610 is scaled using the ratio of reference pupil plane image obtained at step 620 and target pupil plane image obtained at step 640. This scaling may be performed per point (pixel) on the image of the ghost, based on the ratio at the corresponding points of the reference and target pupil plane images. As such, this step may comprise determining a modelled dark field ghost image $G_{DFmod}$, per point from each reference dark field ghost image $G_{DFref}$ (identified at step 610) according to the following equation, where $Pu_T$ is the target pupil plane image measured at step 640 and $Pu_{ref}$ is the reference pupil plane image measured at step 620 (both $Pu_T$ and $Pu_{ref}$ may be normalized for measurement dose; in the pupil images this can be done via the reference pupil channels on the camera):

$$G_{DFmod} = G_{DFref} \times \frac{Pu_T}{Pu_{ref}}$$

An additional scaling may also be applied based on the ratio of the total source energy $ES_{ref}$ corresponding to the reference measurement of step 600 and the total source energy $ES_T$ corresponding to the target measurement of step 630 (e.g., as measured using an energy sensor during each of those steps); i.e.:

$$G_{DFmod} = G_{DFref} \times \frac{Pu_T}{Pu_{ref}} \times \frac{ES_T}{ES_{ref}}$$

Each modelled dark field ghost image $G_{DFmod}$ can then be used to correct the measured images obtained at step 630 such as during a standard process flow (e.g., metrology on production substrates for monitoring and quality control). This may comprise subtracting each modelled dark field ghost image $G_{DFmod}$ from a corresponding measured dark field ghost image $G_{DFmeas}$ to obtain a ghost-corrected dark field image $I_{DFcorr}$:

$$I_{DFcorr} = G_{DFmeas} - G_{DFmod}$$

It can be shown that the corrected dark field image $I_{DFcorr}$ has a substantially reduced the ghost residual, comprising only oscillating ripples, compared to present ghost calibration techniques. The integral over the ripples is zero (zero net energy) and therefore there is a lower application level impact.

As mentioned previously, in another embodiment, the pupil scaling described above can be applied to correct pupil plane measurements (e.g., angle resolved scatterometry). The process dependent ghosts in this embodiment may comprise glow in dark regions of the pupil where there should be no illumination, caused by scattering at low angles by e.g., rough surfaces and shifted reflections due to imperfections of various coatings, nonparallelism and finite thickness of optical elements.

Figure 7:
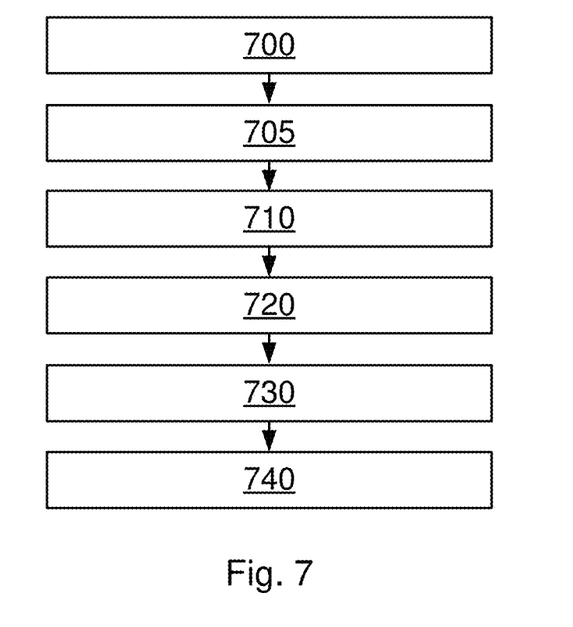
FIG. 7 is a flowchart of a method according to a second embodiment of the invention.

FIG. 7 is a flow diagram showing a second calibration method according to a pupil plane embodiment (i.e., for correcting process dependent ghosts in a pupil plane measurement). In this embodiment, a calibration ghost is modeled using the ghost from a reference (non diffracting) stack (e.g., reference substrate or fiducial).

At step 700, A pupil image from a target is obtained using the illumination mode corresponding to a current application of interest, to obtain target pupil intensity distribution $I_{ST,AP1}(x,y)$ (i.e., sensing image from the target). At the same time reference pupil intensity distribution $I_{RT,AP1}(x,y)$ (i.e., reference image from the target) may be obtained using a reference branch of the metrology apparatus.

At step 705, a reference angularly resolved ghost $I_{SR,AP1}$ (x,y) (i.e., reference pupil plane ghost image) is obtained from a measurement using a known reference stack. Simultaneously, a corresponding angularly resolved reference branch image $I_{RR,AP1}(x,y)$ from a reference branch of the metrology apparatus may be obtained. Both steps 700 and 705 may be performed using an illumination mode (AP1) corresponding to a current application of interest. For example, the illumination mode may comprise quad illumination (e.g., using aperture 13c in FIG. 3(*a*)) for focus metrology or annular illumination (e.g., using aperture 13a in FIG. 3(*a*)) for overlay.

At step 710, a reference angularly resolved spectrum $I_{SR,AP2}$ (x,y) (pupil plane image) is obtained from a known reference (e.g., a silicon fiducial) using an aperture (illumination mode) AP2 which covers the area within the pupil comprising the location of the ghost that is to be removed. This may be a quad aperture, for example. The reference stack should not have locations of zero intensity when imaged with this quad aperture, and should not diffract at all. As with the previous example, the reference stack may comprise a reflector such as a silicon fiducial. Simultaneously, a corresponding angularly resolved reference branch image $I_{RR,AP2}$ (x,y) from a reference branch of the metrology apparatus may be obtained.

At step 720, a target angularly resolved spectrum $I_{ST,AP2}$ (x,y) from a target of interest is obtained using the aperture which covers the ghost location. Again this may be a quad aperture. For some applications, e.g., focus metrology, this step is already part of the metrology flow. Simultaneously, a corresponding angularly resolved reference branch image $I_{RR,AP2}(x,y)$ from a reference branch of the metrology apparatus may be obtained.

At step 730 a pupil scaling factor S is calculated per pixel as a ratio of reference and target pupil plane images, i.e.:

$$S = I_{ST,AP2}(x,y) / I_{SR,AP2}(x,y)$$

At step 740, the scaling coefficient is applied to the reference angularly resolved ghost obtained at Step 700 to obtain a modelled ghost $I_{GT}(x,y)$. This modelled ghost can then be subtracted from measured pupil images during the standard application flow. The modelled ghost may be determined according to:

$$I_{GT}(x,y) = I_{ST,AP2}(x,y) / I_{SR,AP2}(x,y) * I_{SR,AP1}(x,y)$$

As with the previous embodiment, a normalization can be added using normalization with mean or total intensities of pupils from the reference branch. If this is done, the modelled ghost becomes:

$$I_{GT}(x, y) = \frac{(I_{ST,AP2}(x, y) * I_{RT,AP1} * I_{RR,AP2})}{(I_{SR,AP2}(x, y) * I_{RR,AP1} * I_{RT,AP2})} I_{SR,AP1}(x, y)$$

To summarize, the methods described herein can be used to remove process dependent ghosts from metrology measurements and therefore improve accuracy in determination of a parameter of interest (e.g., focus or overlay). The method can be performed as a calibration stage to obtain calibration images once per day/lot/wafer depending on circumstances and time constraints. However, for some applications, the method (i.e., obtaining a modeled ghost using a pupil plane measurement ratio as described) may be applied inline, as part of a metrology flow during (for example) production. As such, inline ghost modelling and correction is also within the scope of the teachings herein. In addition, the proposed method takes into account all polarization dependent ghost effects as well, and is applicable to both pupil and field measurements, when adapted accordingly.

While the target structures described above are metrology target structures specifically designed and formed for the purposes of measurement, in other embodiments, properties may be measured on target structures which are functional parts of devices formed on the substrate. Many devices have regular, grating-like structures. The terms 'target grating' and 'target structure' as used herein do not require that the structure has been provided specifically for the measurement being performed. Further, pitch P of the metrology target structures is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

Figure 2:
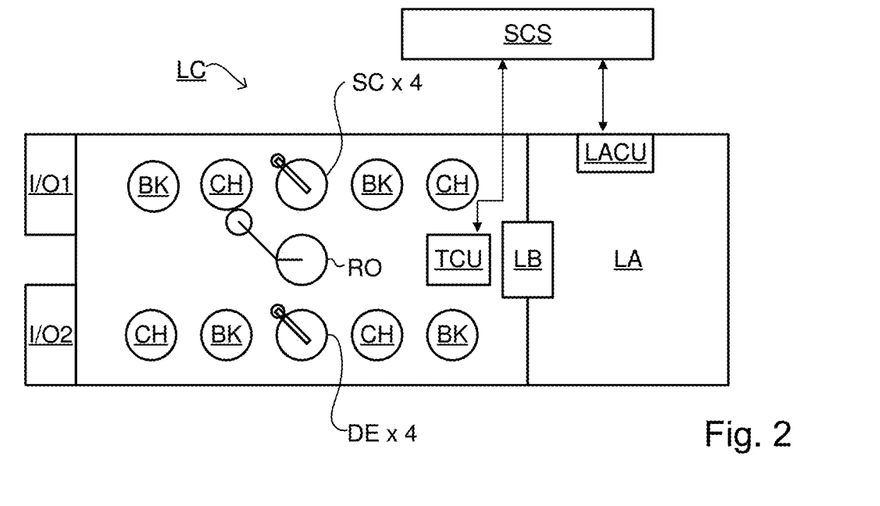
FIG. 2 depicts a lithographic cell or cluster according to an embodiment of the invention.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to calculate overlay error or other parameters with reduced sensitivity to other asymmetry errors.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Further embodiments according to the invention are described in below numbered clauses:

1. A method of mitigating for a process dependent stray light artifact on a measurement of a structure, said method comprising obtaining a calibration scaling factor for the process dependent stray light artifact based on a reference angle resolved measurement and target angle resolved measurement.

2. A method according to clause 1, wherein the calibration scaling factor is determined from a ratio of the reference angle resolved measurement and target angle resolved measurement.

3. A method according to clause 2, wherein the calibration scaling factor is determined as the ratio of the reference angle resolved measurement and target angle resolved measurement for each pixel of the process dependent stray light artifact.

4. A method according to any preceding clause, wherein the reference angle resolved measurement comprises a reference angle resolved measurement of at least the zeroth order and the target angle resolved measurement comprises a target angle resolved measurement of at least the zeroth order.

5. A method according to clause 4, wherein the reference angle resolved measurement is obtained from a zeroth order angle resolved spectrum obtained from measurement of a reference substrate and the target angle resolved measurement is obtained from a zeroth order angle resolved spectrum obtained from measurement of the target.

6. A method according to any preceding clause, comprising:
   obtaining a reference artifact image of the process dependent stray light artifact using a reference substrate; and
   applying the calibration scaling factor to the reference artifact image to obtain a modeled artifact image.

7. A method according to clause 6, comprising subtracting the modeled artifact image from a corresponding stray light artifact detected in one or more subsequent measurements.

8. A method according to clause 6 or 7, wherein the measurement of the structure comprises detecting an image of the structure at an image plane, said image comprising said process dependent stray light artifact.

9. A method according to clause 8, comprising a pattern recognition step to identify all process dependent stray light artifacts in said reference artifact image.

10. A method according to clause 8 or 9, wherein an illumination mode used during the reference angle resolved measurement and target angle resolved measurement separates the zeroth order from higher diffraction orders in the pupil plane.

11. A method according to clause 8, 9 or 10, wherein the modeled artifact image is further scaled by the ratio of an energy level corresponding to the reference artifact image and an energy level corresponding to a measurement for which the process dependent stray light artifact is being mitigated.

12. A method according to clause 6 or 7, wherein the measurement of the structure comprises detecting an angularly resolved image of the structure at a pupil plane, said image comprising said process dependent stray light artifact.

13. A method according to clause 12, wherein the reference angle resolved measurement and target angle resolved measurement are each performed using an illumination mode for which the area within the pupil plane comprising the artifact being mitigated for is blocked.

14. A method according to clause 12 or 13, wherein the reference artifact image of the process dependent stray light artifact is obtained using an illumination mode applicable to a parameter of interest being determined.

15. A method according to any of clauses 1 to 5, wherein the measurement of the structure comprises detecting an image of the structure at an image plane, said image comprising said process dependent stray light artifact.

16. A method according to any preceding clause, comprising determining a parameter of interest from the measurement of the structure.

17. A method according to clause 16, wherein the parameter of interest is focus or overlay.

18. An inspection apparatus for measuring a parameter of interest of a lithographic process, the inspection apparatus being operable to perform the method of any preceding clause.

19. A non-transitory computer program product comprising machine-readable instructions for causing a processor to cause performance of the method of any of clauses 1 to 17.

20. A system comprising:
an inspection apparatus configured to provide a beam of measurement radiation on a target on a substrate and to detect radiation scattered by the target to determine a parameter of interest of a patterning process; and
the non-transitory computer program product of clause 19.

21. The system of clause 20, further comprising a lithographic apparatus having a support structure configured to hold a patterning device to modulate a radiation beam and a projection system arranged to project the modulated radiation beam onto a radiation-sensitive substrate;
wherein said lithographic apparatus is operable to use said parameter of interest in a patterning process on subsequent substrates.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of mitigating for a process dependent stray light artifact on a measurement of a structure, the method comprising:
obtaining a calibration scaling factor for the process dependent stray light artifact based on a reference angle resolved measurement and target angle resolved measurement,
wherein the reference angle resolved measurement is obtained from a reference substrate and the target angle resolved measurement is obtained from a target.

2. The method of claim 1, wherein the calibration scaling factor is determined from a ratio of the reference angle resolved measurement and target angle resolved measurement.

3. The method of claim 2, wherein the calibration scaling factor is determined as the ratio of the reference angle resolved measurement and target angle resolved measurement for each pixel of the process dependent stray light artifact.

4. The method of claim 1, wherein the reference angle resolved measurement comprises at least the zeroth order and the target angle resolved measurement comprises at least the zeroth order.

5. The method of claim 4, wherein the reference angle resolved measurement is obtained from a zeroth order angle resolved spectrum obtained from measurement of the reference substrate and the target angle resolved measurement is obtained from a zeroth order angle resolved spectrum obtained from measurement of the target.

6. The method of claim 1, comprising:
obtaining a reference artifact image of the process dependent stray light artifact using the reference substrate; and
applying the calibration scaling factor to the reference artifact image to obtain a modeled artifact image.

7. The method according to claim 6, comprising subtracting the modeled artifact image from a corresponding stray light artifact detected in one or more subsequent measurements.

8. The method of claim 6, wherein the measurement of the structure comprises detecting an image of the structure at an image plane, the image comprising the process dependent stray light artifact.

9. The method of claim 8, comprising a pattern recognition step to identify all process dependent stray light artifacts in the reference artifact image.

10. The method of claim 8, wherein an illumination mode used during the reference angle resolved measurement and target angle resolved measurement separates the zeroth order from higher diffraction orders in the image plane.

11. The method of claim 8, wherein the modeled artifact image is further scaled by the ratio of an energy level corresponding to the reference artifact image and an energy level corresponding to a measurement for which the process dependent stray light artifact is being mitigated.

12. The method of claim 6, wherein the measurement of the structure comprises detecting an angularly resolved image of the structure at a pupil plane, the angularly resolved image comprising the process dependent stray light artifact.

13. The method of claim 12, wherein the reference angle resolved measurement and target angle resolved measurement are each performed using an illumination mode for which the area within the pupil plane comprising the artifact being mitigated for is blocked.

14. The method of claim 12, wherein the reference artifact image of the process dependent stray light artifact is obtained using an illumination mode applicable to a parameter of interest being determined.

15. The method of claim 1, wherein the measurement of the structure comprises detecting an image of the structure at an image plane separate from a pupil plane, the image comprising the process dependent stray light artifact.

16. The method of claim 1, comprising determining a parameter of interest from the measurement of the structure.

17. The method of claim 16, wherein the parameter of interest is focus or overlay.

18. An inspection apparatus for measuring a parameter of interest of a lithographic process, the inspection apparatus being operable to perform the method of claim 1.

19. A non-transitory computer program product comprising machine-readable instructions for causing a processor to cause performance of an operation for mitigating for a process dependent stray light artifact on a measurement of a structure, the operations comprising:
obtaining a calibration scaling factor for the process dependent stray light artifact based on a reference angle resolved measurement and target angle resolved measurement,
wherein the reference angle resolved measurement is obtained from a reference substrate and the target angle resolved measurement is obtained from a target.

20. A system comprising:
an inspection apparatus configured to provide a beam of measurement radiation on a target on a substrate and to detect radiation scattered by the target to determine a parameter of interest of a patterning process; and
the non-transitory computer program product of claim 19.

\* \* \* \* \*